United States Patent
Burst et al.

(10) Patent No.: US 10,134,590 B2
(45) Date of Patent: Nov. 20, 2018

(54) METHODS OF GROWING CDTE-BASED MATERIALS AT HIGH RATES

(71) Applicant: Alliance for Sustainable Energy, LLC, Golden, CO (US)

(72) Inventors: James M. Burst, Lakewood, CO (US); David S. Albin, Denver, CO (US); Eric Colegrove, Denver, CO (US); Matthew O. Reese, Golden, CO (US); Helio R. Moutinho, Littleton, CO (US); Wyatt K. Metzger, Louisville, CO (US); Joel N. Duenow, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 15/470,195

(22) Filed: Mar. 27, 2017

(65) Prior Publication Data
US 2018/0277365 A1    Sep. 27, 2018

(51) Int. Cl.
| | | |
|---|---|---|
| *C30B 29/48* | (2006.01) | |
| *H01L 21/02* | (2006.01) | |
| *C30B 11/14* | (2006.01) | |
| *C30B 13/32* | (2006.01) | |
| *C30B 23/06* | (2006.01) | |
| *C30B 23/02* | (2006.01) | |
| *C23C 14/06* | (2006.01) | |
| *C23C 14/24* | (2006.01) | |

(52) U.S. Cl.
CPC .... *H01L 21/02562* (2013.01); *C23C 14/0629* (2013.01); *C23C 14/24* (2013.01); *C30B 11/14* (2013.01); *C30B 13/32* (2013.01); *C30B 23/025* (2013.01); *C30B 23/066* (2013.01); *C30B 29/48* (2013.01); *H01L 21/0248* (2013.01); *H01L 21/02381* (2013.01); *H01L 21/02631* (2013.01)

(58) Field of Classification Search
CPC ......... C30B 23/02; C30B 23/06; C30B 23/08; C30B 29/48
See application file for complete search history.

(56) References Cited

U.S. PATENT DOCUMENTS

| | | | |
|---|---|---|---|
| 8,835,212 B2 * | 9/2014 | Avachat | H01L 31/0296 438/478 |
| 2013/0312824 A1 | 11/2013 | Christensen et al. | |
| 2014/0083505 A1 | 3/2014 | Albin et al. | |
| 2014/0134786 A1 * | 5/2014 | Gessert | H01L 21/0237 438/95 |

(Continued)

OTHER PUBLICATIONS

Alamri, "The growth of CdTe thin film by close space sublimation system," Physica Status Solidi (a), vol. 200, No. 2, 2003, pp. 352-360.

(Continued)

*Primary Examiner* — Robert M Kunemund
(74) *Attorney, Agent, or Firm* — Sam J. Barkley

(57) ABSTRACT

Systems and methods for growing high-quality CdTe-based materials at high growth rates are provided. According to an aspect of the invention, a method includes depositing a first CdTe-based layer on a CdTe-based template at a rate of greater than 1 μm/min. Each of the first CdTe-based layer and the CdTe-based template has a single-crystal structure and/or a large-grain polycrystalline structure. The depositing is performed by physical vapor deposition.

12 Claims, 7 Drawing Sheets

(56) References Cited

U.S. PATENT DOCUMENTS

2014/0261685 A1 9/2014 Liao et al.
2014/0261688 A1 9/2014 Allenic et al.

OTHER PUBLICATIONS

Burst et al., "CdTe solar cells with open-circuit voltage breaking the 1V barrier," Nature Energy, vol. 1, Mar. 2016, pp. 1-7.
Diaz et al., "Selective CdTe Nanoheteroepitaxial Growth on Si(100) Substrates Using the Close-Spaced Sublimation Technique Without the Use of a Mask," Journal of Electronic Materials, Mar. 14, 2013, 9 pages.
Escobedo, "Investigation of CdTe (111) Epitaxial Growth Via Close-Space Sublimation," Ph.D. Thesis Presented to the Faculty of the Graduate School of The University of Texas at El Paso, Department of Electrical and Computer Engineering, May 2008, 122 pages.
Escobedo et al., "Characterization of Smooth CdTe(111) Films by the Conventional Close-Spaced Sublimation Technique," Journal of Electronic Materials, vol. 39, No. 4, 2010; pp. 400-409.
Gao et al., "One-step fast deposition of thick epitaxial CdZnTe film on (001)GaAs by close-spaced sublimation," Crystal Engineering Communication, vol. 14, 2012, pp. 1790-1794.
Jiang et al., "Hetero-epitaxial crystal growth of CdTe on GaAs substrates," Journal of Crystal Growth, vol. 310, 2008, pp. 1652-1656.
Jiang et al., "Close-spaced sublimation growth of homo- and hetero-epitaxial CdTe thick films," Journal of Crystal Growth, vol. 310, 2008, pp. 1664-1668.
Liu et al., "The Growth Model of CdTe Thin Film by Close Spaced Sublimation," IEEE Photovoltaic Specialist Conference, Jun. 14-19, 2015, pp. 1-5.
Moutinho et al., "Investigation of induced recrystallization and stress in close-spaced sublimated and radio-frequency magnetron sputtered CdTe thin films," Journal of Vacuum Science and Technology A, vol. 17, No. 4, Jul./Aug. 1999, pp. 1793-1798.
Noda et al., "Bulk Growth of CdZnTe/CdTe Crystals," Mercury Cadmium Telluride: Growth, Properties and Applications, Chapter 2, John Wiley & Sons, 2011, pp. 21-50.
Quinones, Selective CdTe Single Crystal Deposition on CdTe/Si(211) Substrates by Close Spaced Sublimation (CSS Technique), abstract only, 1 page.
Rudolph et al., "Distribution and genesis of inclusions in CdTe and (Cd,Zn)Te single crystals grown by the Bridgman method and by the travelling heater method," Journal of Crystal Growth, vol. 147, 1995, pp. 297-304.

* cited by examiner

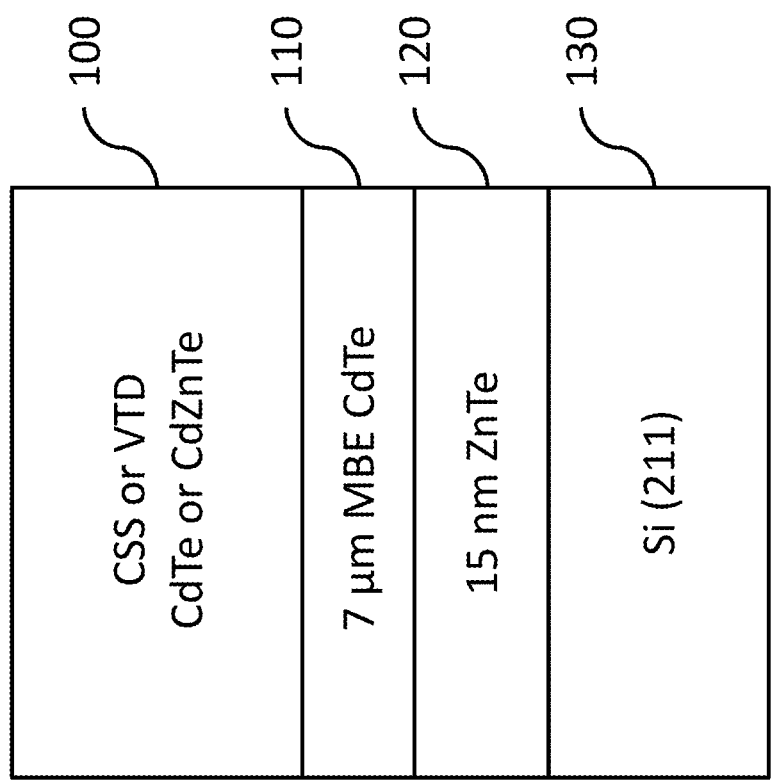

(112)

METHODS OF GROWING CDTE-BASED MATERIALS AT HIGH RATES

CONTRACTUAL ORIGIN

The United States Government has rights in this invention under Contract No. DEAC36-08GO28308 between the United States Department of Energy and the Alliance for Sustainable Energy, LLC, the Manager and Operator of the National Renewable Energy Laboratory.

BACKGROUND OF THE INVENTION

The present invention relates to methods of growing high-quality CdTe-based materials at high rates by physical vapor deposition. CdTe-based single crystals are popular for infrared, x-ray, and gamma-ray detectors, as well as applications such as night image cameras, radiation monitors, and medical equipment. Related art methods to grow CdTe-based single crystals include the Bridgman technique and the traveler heating methods (THM). In these methods, large quantities of bulk CdTe material are melted in furnaces at very high temperatures and slowly cooled to form large single crystals over the course of days. These methods are very expensive and time-consuming.

Another related art approach to grow CdTe-based single crystals is molecular beam epitaxy (MBE). In this technique, CdTe is evaporated in ultrahigh vacuum and made incident onto a substrate target held at a temperature between about 150° C. and about 300° C. With this technique, single crystals typically grow at a rate of about 1 μm per hour. To grow a 70-μm film requires 3 days of equipment time. MBE equipment is very expensive, maintenance requirements are frequent, and operation is costly.

On the other hand, close-spaced sublimation (CSS) and vapor transport deposition (VTD), performed under moderate vacuum conditions of approximately 10 Torr, deposit CdTe at rates 100-1000 times faster than MBE. However, CdTe-based materials grown by these related art methods to date have been polycrystalline with small grains having a grain size that is roughly on the order of the film thickness, or about a micron or two in typical thin films. The grain boundaries are defective and reduce performance, but the low cost and fast throughput are advantageous for photovoltaic applications. Accordingly, it would be advantageous to provide a low-cost method of growing single-crystal or large-grain polycrystalline CdTe-based materials at fast growth rates.

SUMMARY OF THE INVENTION

Exemplary embodiments of the invention provide methods for growing high-quality CdTe-based materials at high growth rates. According to an aspect of the invention, a method includes depositing a first CdTe-based layer on a CdTe-based template at a rate of greater than 1 μm/min. Each of the first CdTe-based layer and the CdTe-based template has a single-crystal structure and/or a large-grain polycrystalline structure. The depositing is performed by physical vapor deposition. The physical vapor deposition may include close-spaced sublimation (CSS) or vapor transport deposition (VTD).

The first CdTe-based layer may include CdTe or CdZnTe. The CdTe-based template may include CdTe, CdZnTe, CdMgTe, CdMnTe, HgCdTe, or an alloy thereof.

The method may also include maintaining a temperature of a source of the first CdTe-based layer between 500° C. and 700° C. during the depositing. The method may also include maintaining a temperature of a substrate on which the first CdTe-based layer is deposited between 200° C. and 650° C. during the depositing.

The CdTe-based template may be deposited by molecular beam epitaxy (MBE), Bridgman growth, or a traveling heater method (THM). The CdTe-based template may be deposited on a ZnTe layer, which is deposited on a Si substrate. The CdTe-based template may have a thickness between 10 nm and 1 mm. An average grain size of the first CdTe-based layer may be greater than twice a thickness of the first CdTe-based layer.

The method may also include doping the first CdTe-based layer. The first CdTe-based layer may be doped with As or P. The method may also include annealing the first CdTe-based layer at a temperature between 400° C. and 700° C. for a duration between 30 seconds and 30 minutes.

Other objects, advantages, and novel features of the present invention will become apparent from the following detailed description of the invention when considered in conjunction with the accompanying drawings.

BRIEF DESCRIPTION OF THE DRAWINGS

FIG. 1 shows an example of a structure that includes a single-crystal or large-grain polycrystalline CdTe-based material grown by physical vapor deposition according to exemplary embodiments of the invention;

DETAILED DESCRIPTION OF EXEMPLARY EMBODIMENTS

Figure 2A:
FIGS. 2(a)-2(c) show a scanning electron microscope (SEM) image and planar electron backscatter diffraction (EBSD) maps of a CdTe layer grown by CSS on a Si/CdTe substrate.

Exemplary embodiments of the present invention grow high-quality single-crystal or large-grain polycrystalline CdTe-based materials by using fast physical vapor deposition methods, such as CSS or VTD, at high growth rates greater than 1 μm/min. For example, according to the methods discussed below, it is possible to grow nearly 70 μm of single-crystal CdTe in 8 minutes by CSS in low vacuum. Growing a similar film by MBE requires three days and has considerably higher costs. As used in this disclosure, a large-grain polycrystalline material has an average grain size that is greater than twice a thickness of the material layer.

In order to deposit the single-crystal or large-grain polycrystalline material at high growth rates by physical vapor deposition, the temperature of the source of the CdTe-based material may be between 500° C. and 700° C. Further, the temperature of a substrate on which the CdTe-based material is deposited may be between 200° C. and 650° C. Any suitable growth ambients may be used, such as He, $O_2$, $H_2$, $N_2$, Ar, or combinations thereof. The growth pressure may be between 0.5 Torr and 500 Torr. The flux of CdTe atoms onto the substrate should be greater than the sublimation rate caused by the substrate temperature and ambient pressure.

The single-crystal or large-grain polycrystalline material is grown epitaxially by physical vapor deposition on a template, such that the structure of the single-crystal or large-grain polycrystalline material matches the structure of the template. Some examples of suitable templates include single-crystal or large-grain polycrystalline CdTe, CdZnTe, CdMgTe, CdMnTe, HgCdTe, or alloys thereof. The template may be formed by methods such as MBE, Bridgman growth, or THM. The template may have any suitable thickness, such as between 10 nm and 1 mm.

FIG. 1 shows an example of a structure that includes a single-crystal or large-grain polycrystalline CdTe-based material grown by physical vapor deposition according to exemplary embodiments of the invention. The thicknesses of the layers shown in FIG. 1 are not drawn to scale. In the example shown in FIG. 1, a ZnTe layer 120 is deposited on a Si substrate 130. In general, the substrate 130 may have a thickness between tens of nm to several mm. Alternatively, the substrate 130 may have a greater thickness. One advantage of exemplary embodiments of the invention is that variable widths and lengths of the substrate 130 may be used, including substrates 130 that are meters across, allowing for unprecedented high-throughput single-crystal production. The ZnTe layer 120 may have any suitable thickness, such as 15 nm in this example.

A single-crystal or large-grain polycrystalline layer of CdTe 110 is then deposited as a template on the ZnTe layer 120 by MBE. The CdTe layer 110 may have any suitable thickness, such as 7 μm in this example. A single-crystal or large-grain layer of CdTe or CdZnTe 100 is then deposited epitaxially on the CdTe template layer 110 by CSS or VTD. Various other materials may be used, including polycrystalline films, II-VI materials such as CdTe, CdZnTe, HgCdTe, and others as described in the examples below. The single-crystal or large-grain layer 100 may be grown to desired thicknesses. One advantage is that the material is epitaxial at the interface without the emergence of small grains, so a high-quality single-crystal or large-grain layer 100 that has a thickness of only tens of nm may be grown. Thicknesses typical for photovoltaic and detector applications, which range from 1 micron to several mm, can be grown in very little time relative to related art techniques.

Figure 2B:
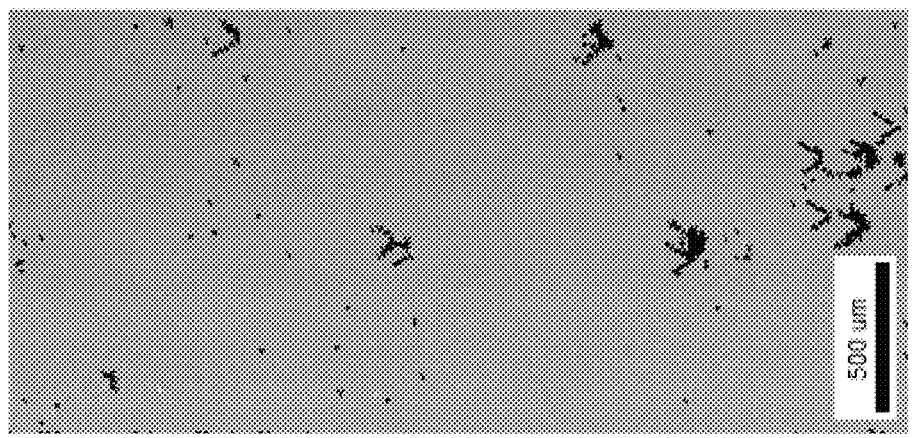
Figure 2C:
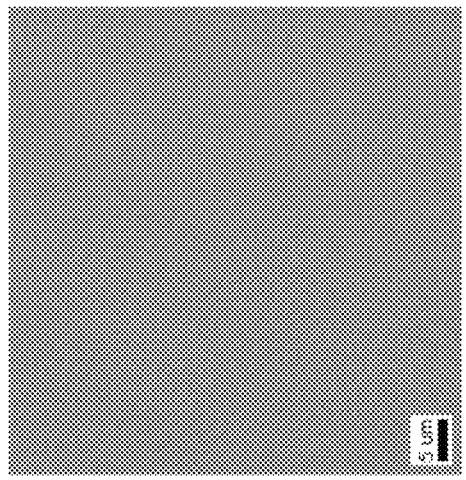

FIG. 2(a) shows a planar scanning electron microscope (SEM) image of a CdTe layer grown by CSS on a Si/CdTe substrate at a rate of 8 um/min. FIG. 2(b) shows a planar electron backscatter diffraction (EBSD) map of the same CdTe layer, and FIG. 2(c) shows an EBSD map of the same CdTe layer after the surface has been cleaned. FIGS. 2(a)-2(c) indicate that the CdTe layer is a single-crystal material across large areas. In this example, the layers were grown on 1.5 in×1.5 in areas with source and substrate temperatures of 660° C. and 600° C., respectively, in a 15 Torr ambient gas.

Figure 3B:
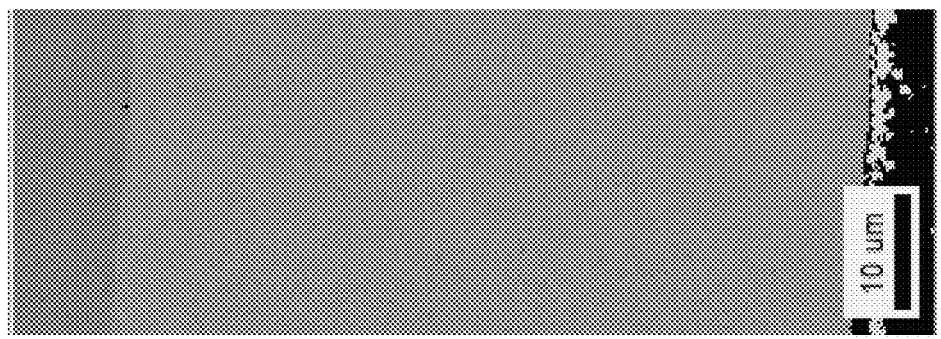
FIGS. 3(a) and 3(b) show SEM and EBSD cross-sections, respectively, of CdTe grown by CSS on a CdTe/Si substrate.
Figure 3A:
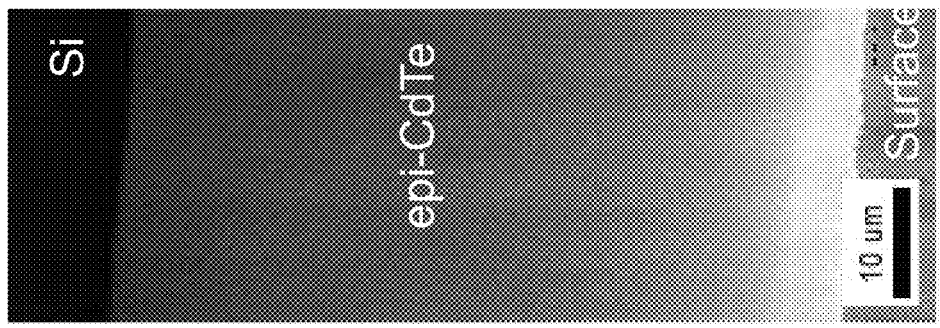

FIGS. 3(a) and 3(b) show SEM and EBSD cross-sections, respectively, of CdTe grown by CSS on a CdTe/Si substrate. These figures demonstrate that the CdTe grown by CSS is indistinguishable from the substrate, such that the interface is high-quality single-crystal material (based on x-ray diffraction (XRD) and other analyses). The CdTe grown by CSS has a thickness of approximately 64 μm and was grown in 8 minutes, for a growth rate of approximately 8 μm/min. In contrast, to grow the same thickness of CdTe by MBE would require 3 full days. The CdTe grown by CSS is single-crystal throughout, including at the CdTe interface. No grain boundaries are observed on the scale of millimeters laterally, or through the thickness of the CdTe film (tens of microns). The first tens of nm of material is single-crystal. High quality films of just tens of nm can be grown. The ratio of the grain size to the film thickness approaches infinity, and the bulk lifetime is 10 ns.

Figure 4B:
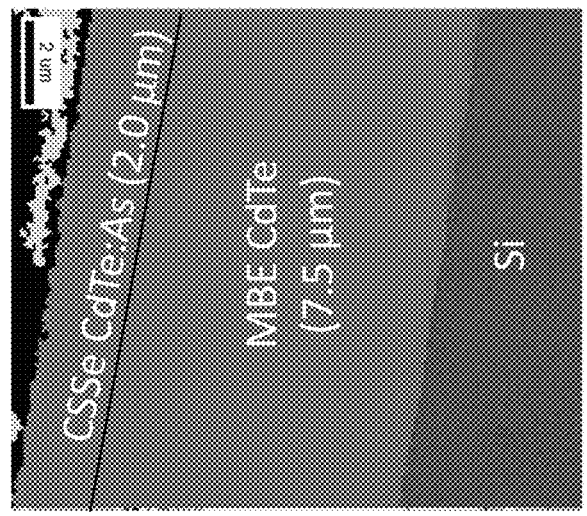
FIGS. 4(a) and 4(b) show an EBSD back surface and an EBSD cross-section, respectively, of an As-doped single-crystal CdTe film grown epitaxially by CSS on a CdTe template grown by MBE.
Figure 4A:
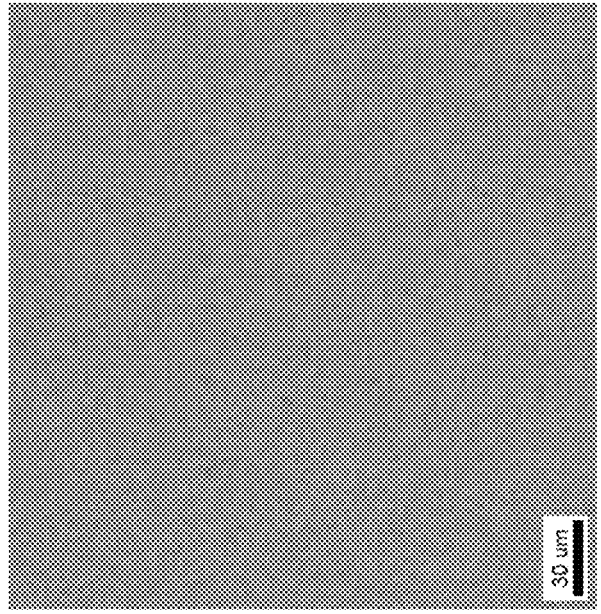

The methods discussed above may also be used to grow doped single-crystal or large-grain materials. For example, FIGS. 4(a) and 4(b) show an EBSD back surface and an EBSD cross-section, respectively, of an As-doped single-crystal CdTe film grown epitaxially by CSS on a CdTe template grown by MBE. In this example, the dopant is embedded into the CdTe source material. This can be done by mixing CdTe with a material containing a dopant such as $Cd_3As_2$, $Cd_3P_2$, or CdSb for As, P, or Sb, respectively; subjecting CdTe to anneals in vapors of the above compounds or other mixtures with dopants; or placing the dopant into a CdTe melt. In this example, $Cd_3As_2$ was placed into a melt of CdTe. During the physical vapor deposition, the dopant in the source material is incorporated into the resulting CdTe film as it is deposited. Dopant incorporation levels may vary from trace amounts to $10^{19}$ cm$^{-3}$ by adjusting the source material concentration and growth conditions. FIG. 4(a) shows that the CdTe film is single-crystal, and FIG. 4(b) shows that there is no difference between the CdTe template grown by MBE and the CdTe film grown by CSS.

Figure 5B:
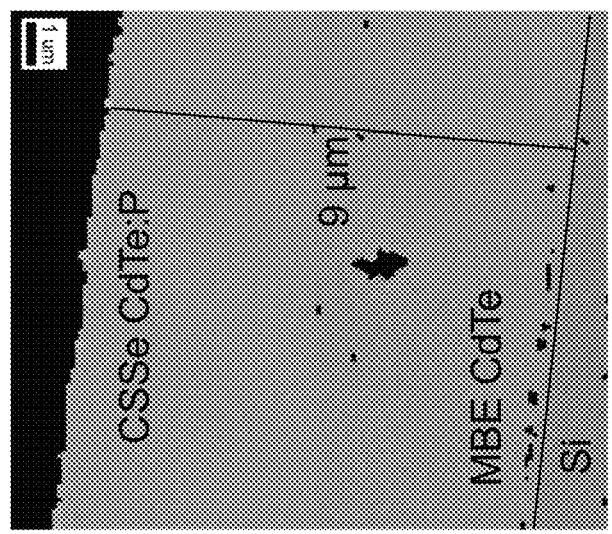
FIGS. 5(a) and 5(b) show an EBSD back surface and an EBSD cross-section, respectively, of a P-doped single-crystal CdTe film grown epitaxially by CSS on a CdTe template grown by MBE.
Figure 5A:
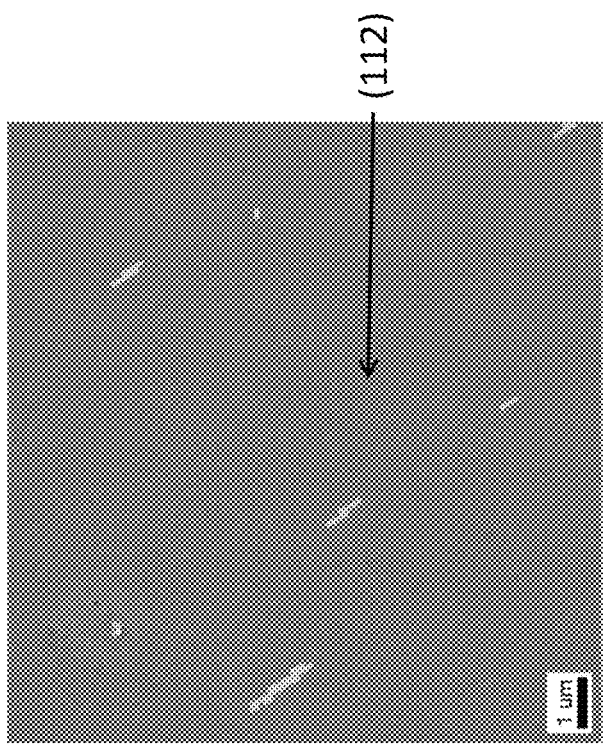

Similarly, FIGS. 5(a) and 5(b) show an EBSD back surface and an EBSD cross-section, respectively, of a P-doped single-crystal CdTe film grown epitaxially by CSS on a CdTe template grown by MBE. FIG. 5(a) shows that the CdTe film is single-crystal, and FIG. 5(b) shows that there is no difference between the CdTe template grown by MBE and the CdTe film grown by CSS. Other dopants from the Group I and Group III columns may be used to dope the Cd site, such as Cu, Ag, Au, Na, In, and K. Similarly, other Group V and Group VII dopants may be used to dope the Te site, including As, N, Sb, Bi, Cl, and I. For example, CdTe may be doped with As or P with a substrate temperature between 200° C. and 600° C., and a source temperature between 550° C. and 700° C., in inert ambients with a pressure between 8 Torr and 20 Torr.

Figure 6B:
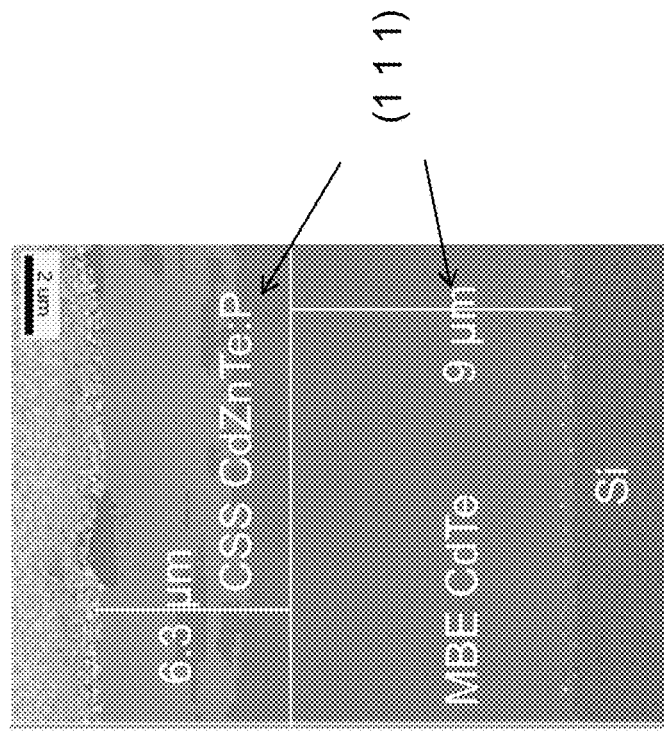
FIGS. 6(a) and 6(b) show an EBSD back surface and an EBSD cross-section, respectively, of a P-doped single-crystal CdZnTe film grown epitaxially by CSS on a CdTe template grown by MBE.
Figure 6A:
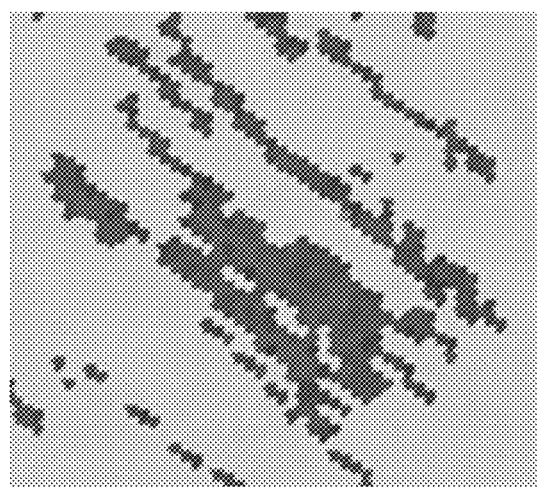

Further, FIGS. 6(a) and 6(b) show an EBSD back surface and an EBSD cross-section, respectively, of a P-doped single-crystal CdZnTe film grown epitaxially by CSS on a CdTe template grown by MBE. In this example, a hole density of $5 \times 10^{16}$ was achieved in the CdZnTe:P film by annealing at a temperature between 400° C. and 700° C. for a duration between 30 seconds and 30 minutes after the deposition. FIG. 6(a) shows the top surface of a CdZnTe film (away from the growth interface) for a film grown with $Cd_{0.94}Zn_{0.06}Te$:P powder at a source temperature of 700° C. and a nominal substrate temperature of 200° C. for 2 minutes in an 8 Torr $N_2$ ambient. The EBSD indicates a single-crystal material with a 60° rotation between two orientations. These coincident site lattice (CSL) Σ3 boundaries are probably twin planes that do not significantly affect the electro-optical properties of the film, such that electrons and holes are able to transport across twin planes with minimal carrier recombination. FIG. 6(b) also shows the two orientations observed on the top surface of the CdZnTe film. The results indicate that crystalline CdZnTe can be grown on lattice mismatched CdTe without the emergence of small grains at the interface. Furthermore, Hall measurements indicate that these films can obtain hole densities exceeding $1 \times 10^{16}$ cm$^{-3}$. Accordingly, exemplary embodiments of the present invention are able to grow high quality interfaces and single-crystal materials at high rates, in low vacuum, for lattice mismatched materials.

Figure 7:
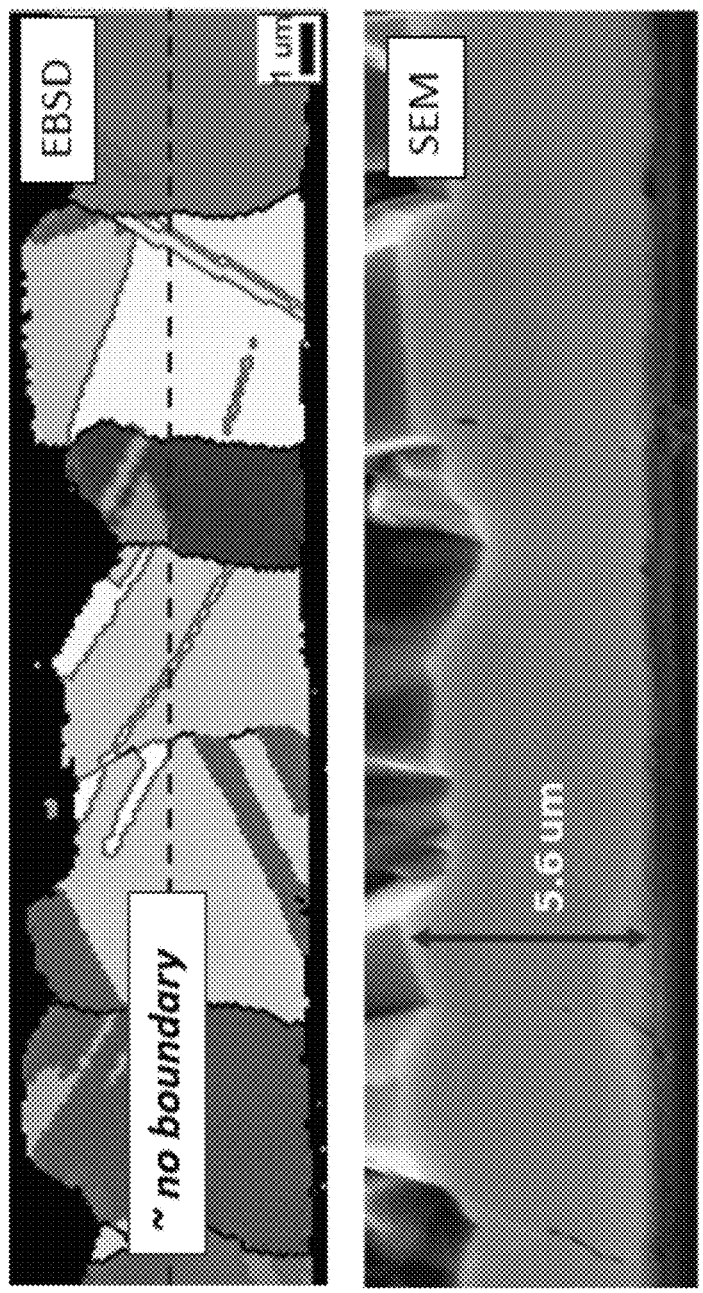
FIG. 7 shows the growth of large-grain polycrystalline CdTe by CSS on a large-grain polycrystalline CdTe template.

Exemplary embodiments of the present invention may grow single-crystal or large-grain polycrystalline materials. For example, FIG. 7 illustrates the growth of large-grain polycrystalline CdTe by CSS with a source temperature between 600° C. and 700° C. and a substrate temperature between 500° C. and 600° C. on a large-grain polycrystalline CdTe template. As shown in FIG. 7, the interface between the layers is completely epitaxial.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method comprising:
depositing a first CdTe-based layer on a CdTe-based template at a rate of between 1 μm/min to 8 μm/min, wherein:
each of the first CdTe-based layer and the CdTe-based template has at least one of a single-crystal structure or a large-grain polycrystalline structure, and
the depositing is performed by physical vapor deposition while maintaining a temperature of a substrate on which the first CdTe-based layer is deposited between 400° C. and 650° C. during the depositing.

2. The method according to claim 1, wherein the physical vapor deposition comprises close-spaced sublimation (CSS) or vapor transport deposition (VTD).

3. The method according to claim 1, wherein the first CdTe-based layer comprises CdTe or CdZnTe.

4. The method according to claim 1, wherein the CdTe-based template comprises CdTe, CdZnTe, CdMgTe, CdMnTe, HgCdTe, or an alloy thereof.

5. The method according to claim 1, further comprising maintaining a temperature of a source of the first CdTe-based layer between 500° C. and 700° C. during the depositing.

6. The method according to claim 1, wherein the CdTe-based template is deposited by molecular beam epitaxy (MBE), Bridgman growth, or a traveling heater method (THM).

7. The method according to claim 6, wherein the CdTe-based template is deposited on a ZnTe layer, which is deposited on a Si substrate.

8. The method according to claim 1, wherein the CdTe-based template has a thickness between 10 nm and 1 mm.

9. The method according to claim 1, wherein an average grain size of the first CdTe-based layer is greater than twice a thickness of the first CdTe-based layer.

10. The method according to claim 1, further comprising doping the first CdTe-based layer.

11. The method according to claim 10, wherein the first CdTe-based layer is doped with As or P.

12. The method according to claim 10, further comprising annealing the first CdTe-based layer at a temperature between 400° C. and 700° C. for a duration between 30 seconds and 30 minutes.

* * * * *